United States Patent
Kawakita

(10) Patent No.: US 8,563,975 B2
(45) Date of Patent: Oct. 22, 2013

(54) HETERO PN JUNCTION SEMICONDUCTOR AND PROCESS FOR PRODUCING THE SAME

(75) Inventor: Jin Kawakita, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 216 days.

(21) Appl. No.: 13/203,525

(22) PCT Filed: Feb. 26, 2010

(86) PCT No.: PCT/JP2010/053152
§ 371 (c)(1),
(2), (4) Date: Oct. 20, 2011

(87) PCT Pub. No.: WO2010/098464
PCT Pub. Date: Sep. 2, 2010

(65) Prior Publication Data
US 2012/0032166 A1    Feb. 9, 2012

(30) Foreign Application Priority Data

Feb. 27, 2009  (JP) .................. 2009-045406
Jun. 2, 2009   (JP) .................. 2009-132693

(51) Int. Cl.
*H01L 29/10*  (2006.01)
(52) U.S. Cl.
USPC .......................................................... 257/43
(58) Field of Classification Search
USPC .......................................................... 257/43
See application file for complete search history.

(56) References Cited

U.S. PATENT DOCUMENTS

2009/0308458 A1* 12/2009 Aramaki et al. .............. 136/263

* cited by examiner

*Primary Examiner* — Anthony Ho
(74) *Attorney, Agent, or Firm* — Wenderoth, Lind & Ponack, L.L.P.

(57) ABSTRACT

A hetero pn junction semiconductor constituted of an electrically conductive polymer as a p-type semiconductor and an inorganic oxide as an n-type semiconductor, which is characterized in that the electrically conductive polymer is filled among nanoparticles of the inorganic oxide so as to satisfy the following Equation 1:

$$Vp/Vn = X \times \sigma n/\sigma p \, (0.1 \leq X \leq 10) \qquad \text{<Equation 1>}$$

Vp=Volume of the electrically conductive polymer as a p-type semiconductor
σp=Electrical conductivity of the electrically conductive polymer as a p-type semiconductor
Vn=Volume of the inorganic oxide nanoparticles as an n-type semiconductor
σn=Electrical conductivity of the inorganic oxide nanoparticles as an n-type semiconductor The hetero junction semiconductor is produced by mixing and dispersing nanoparticles of the inorganic oxide in a monomer of the electrically conductive polymer; and thereafter, irradiating light upon which the nanoparticles generate holes and simultaneously applying a constant current by controlling at least one of a current density and a current application time, thereby polymerizing the monomer through a photo electrochemical reaction to form an electrically conductive polymer.

4 Claims, 24 Drawing Sheets

(a)

① BOUNDARY PART (b)

② CENTRAL PART (c)

③ TiO$_2$ SURFACE

MARGINAL PART OF SPECIMEN

CENTRAL PART OF SPECIMEN

CENTRAL PART OF SPECIMEN 1.0 μA 1.0hour (a)

① BOUNDARY PART (b)

③ CENTRAL PART (c)

② TiO$_2$ SURFACE (a)

MARGINAL PART OF SPECIMEN (b)

CENTRAL PART OF SPECIMEN (c)

CENTRAL PART OF SPECIMEN 1.0 μA 1.5hour (a)

① BOUNDARY PART (b)

④ CENTRAL PART (c)

③ TiO$_2$ SURFACE (a)

MARGINAL PART OF SPECIMEN (b)

CENTRAL PART OF SPECIMEN (c)

CENTRAL PART OF SPECIMEN 1.0 μA 2.0hour (a)

(b)

HETERO PN JUNCTION SEMICONDUCTOR AND PROCESS FOR PRODUCING THE SAME

TECHNICAL FIELD

The present invention relates to a hetero pn junction semiconductor, especially a hetero pn junction semiconductor constituted of an electrically conductive polymer as a p-type semiconductor and an inorganic oxide as an n-type semiconductor, which can be utilized for diodes, solar cells and the like.

BACKGROUND ART

A material in which an electrically conductive polymer as a p-type semiconductor and an inorganic compound as an n-type semiconductor are complexed on a nano level is expected to act as a solar cell having a hetero pn junction. For that reason, it has been attempted to create the subject solar cell by the methods described in Patent Documents 1 to 3; however, an optimal fine structure or interface structure therefor has not been elucidated yet. Incidentally, according to Non-Patent Document 1, photoelectric data thereof are such a degree as shown in FIG. 27 (FIG. 3 of Non-Patent Document 1). Furthermore, in order to increase a contact area, it may be considered that it is effective to use an agglomerated structure of nanoparticles as one of junction structures; however, since it is difficult to densely fill solid phases each other, a sufficient effect is not obtained, and such a way is only at an ideal stage yet.

In Patent Document 4, generating efficiency is described as follows.

The generating efficiency is calculated according to the following equation:

$$n = e(Va-Vb)/kT(\ln Ia - \ln Ib) \qquad \text{(Equation 1)}$$

(n represents a diode factor; e represents an elementary electric charge; k represents a Boltzmann constant; T represents an absolute temperature; arbitrary two points (Va: voltage, Ia: current) and (Vb, Ib) of a current-voltage characteristic graph in which a current value is logarithmically expressed.)

Then, when n is equal to 1 the equation 2 is an ideal diode equation, and as an electric behavior of junction is deviated from the ideal sate, the value of n becomes large."

Furthermore, it is also described that:

"This diode factor n mainly represents a junction density of the pn junction interface, and when the junction density is high, then n is equal to 1, thereby revealing an ideal interface state. When the junction density is low, the rectification properties become deteriorated. In organic semiconductors, n was conventionally a value of from 2 to 3."

Here, the junction density of the pn junction interface is considered to be an area (adhesive area) of an electrically conductive polymer closely adhered onto the inorganic particle surface by electrolytic polymerization, and it is also described that when the junction density is high, a photocurrent is observed.

The photocurrent is one of factors determining the generating efficiency together with the voltage. In consequence, the adhesive area is an important factor influencing the generating efficiency.

PRIOR ART DOCUMENT

Patent Document

PATENT DOCUMENT 1 JP-A-2006-016582
PATENT DOCUMENT 2 JP-A-2003-142168
PATENT DOCUMENT 3 JP-A-2004-182819
PATENT DOCUMENT 4 JP-A-2004-071682

Non-Patent Document

NON-PATENT DOCUMENT 1 "Solid state dye-sensitized $TiO_2$ solar cell with polypyrrole as hole transport layer", Chemistry Letters, Vol. 26, No. 5 (1997), written by Murakoshi, Kei, Kogure, Ryuichiro, Wada, Yuji and Yanagida, Shozo and published by The Chemical Society of Japan, page 472, FIG. 3: Photocurrent-voltage characteristics of the solid cell using polypyrrole treated at −300 mV (a), and 100 mV (b).

SUMMARY OF THE INVENTION

Problem to be Solved by the Invention

In view of such circumstances, an aim of the present invention is to provide a hetero pn junction semiconductor having a more excellent photoelectric conversion performance, in which an electrically conductive polymer as a p-type semiconductor and nanoparticles of an inorganic oxide as an n-type semiconductor are dispersed and mixed in a closely and adequately packed state which has not been conventionally obtained, and a process for producing the same.

Means for Solving the Problem

Invention 1 is concerned with a hetero pn junction semiconductor constituted of an electrically conductive polymer as a p-type semiconductor and an inorganic oxide as an n-type semiconductor, which is characterized in that the electrically conductive polymer is filled among nanoparticles of the inorganic oxide so as to satisfy the following Equation 1.

$$Vp/Vn = X \times \sigma n/\sigma p \, (0.1 \le X \le 10) \qquad \text{<Equation 1>}$$

Vp=Volume of the electrically conductive polymer as a p-type semiconductor

σp=Electrical conductivity of the electrically conductive polymer as a p-type semiconductor Vn=Volume of the inorganic oxide nanoparticles as an n-type semiconductor σn=Electrical conductivity of the inorganic oxide nanoparticles as an n-type semiconductor Invention 2 is concerned with the hetero pn junction semiconductor of Invention 1, which is characterized in that an average particle size of the nanoparticles of the inorganic oxide is not more than 200 nm.

Invention 3 is concerned with a process for producing the hetero pn junction semiconductor of Invention 1 or 2, which is characterized by permeating a monomer of the electrically conductive polymer among nanoparticles of an inorganic oxide aggregated and adhered on a substrate; and thereafter, irradiating light upon which the nanoparticles generate holes and simultaneously applying a constant current by controlling at least one of a current density and a current application time, thereby polymerizing the monomer through a photo electrochemical reaction to form an electrically conductive polymer and thereby producing a hetero pn junction semiconductor.

Effect of the Invention

The hetero pn junction semiconductor of Invention 1 or 2 is one in which an electrically conductive polymer as a p-type semiconductor and nanoparticles of an inorganic oxide as an n-type semiconductor are dispersed and mixed in a closely and adequately packed state which has not been conventionally obtained, and exhibits a more excellent photoelectric conversion performance without causing mingling of a dye into the resulting product.

Also, according to the process of Invention 3, in the present invention, it is possible to produce a hetero pn junction semiconductor having a more excellent photoelectric conversion performance, in which an electrically conductive polymer as a p-type semiconductor and nanoparticles of an inorganic oxide as an n-type semiconductor are dispersed and mixed in a closely and adequately packed state which has not been conventionally obtained, by permeating a monomer solution that is a precursor of an electrically conductive polymer among inorganic semiconductor nanoparticles; and irradiating light upon which the nanoparticles generate holes and simultaneously applying a constant current by controlling at least one of a current density and a current application time, thereby polymerizing the monomer through a photo electrochemical reaction to form an electrically conductive polymer.

MODE FOR CARRYING OUT THE INVENTION

Figure 1:
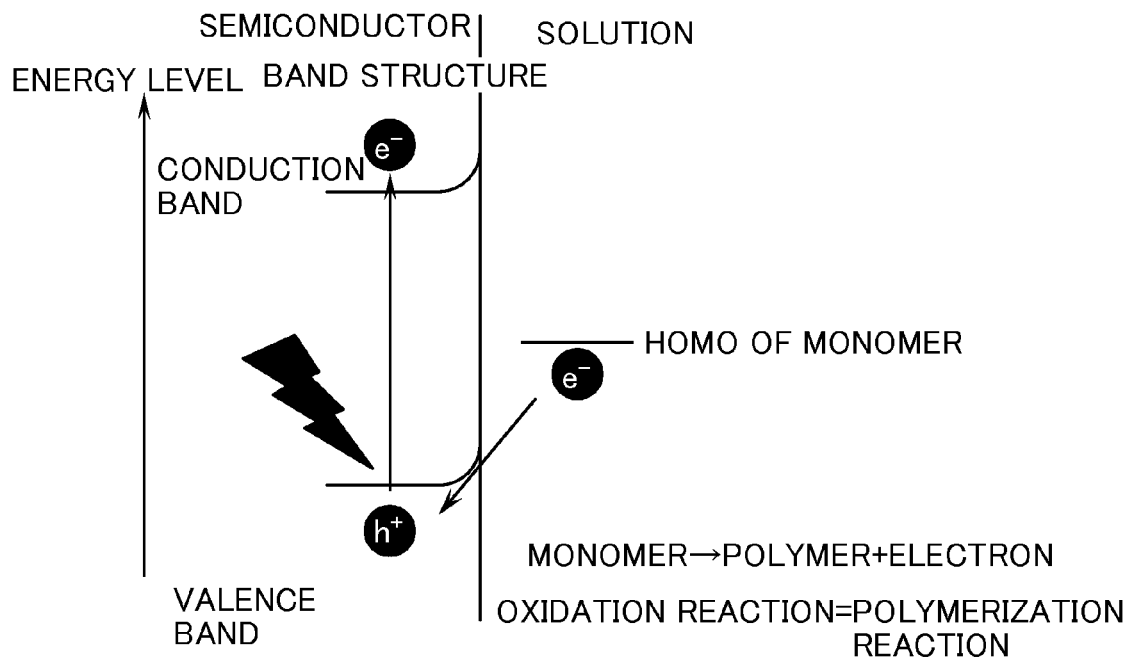
FIG. 1 is a schematic model showing photoelectrolytic oxidative polymerization.

In the hetero pn junction semiconductor of the present invention, an electrically conductive polymer as a p-type semiconductor is filled among nanoparticles of an inorganic oxide as an n-type semiconductor so as to satisfy the following <Equation 1>.

$$Vp/Vn = X \times \sigma n/\sigma p \quad (0.1 \leq X \leq 10) \qquad \text{<Equation 1>}$$

Vp=Volume of the electrically conductive polymer as a p-type semiconductor

σp=Electrical conductivity of the electrically conductive polymer as a p-type semiconductor Vn=Volume of the inorganic oxide nanoparticles as an n-type semiconductor σn=Electrical conductivity of the inorganic oxide nanoparticles as an n-type semiconductor When X is too small, though the amount of the required electrically conductive polymer as a p-type semiconductor may be decreased, in actual, it is difficult to ensure an electrical conductive path by connecting electrically conductive polymers. When X is surplus, even if all of voids among the inorganic oxide nanoparticles as an n-type semiconductor are filled with the electrically conductive polymer as a p-type semiconductor, a balance of electrical resistance among the semiconductors conspicuously breaks down. In consequence, it is desirable that X falls within the foregoing range.

In this Equation 1, the volume can be, for example, calculated by making one image of an SEM photograph of the resulting hetero pn junction semiconductor as a subject and defining an area of the inorganic oxide nanoparticles occupying therein as Vn, with an area of the electrically conductive polymer being defined as Vp. Also, as to the respective electrical conductivities, values described in handbooks or references may be adopted.

In view of the fact that the smaller the average particle diameter of the nanoparticles of the inorganic oxide is, the more favorable results are obtainable, it is desirable that the average particle diameter of nanoparticles of the inorganic oxide is preferably not more than 200 nm, and more preferably not more than 20 nm. A lower limit thereof is about 5 nm from the viewpoint of manufacture.

Light having a wavelength of the size of the particle diameter of the nanoparticles or more, for example, ultraviolet to visible lights, can transmit therethrough without being scattered by the particles. Among the transmitted lights, light having a wavelength of band gap energy or more contributes to a photo-excitation reaction at the absorption.

Therefore, it is effective to take a large wavelength width of light capable of being transmitted by making the diameter of the nanoparticles small as far as possible.

As to the hetero pn junction semiconductor, an electrically conductive polymer can be formed by permeating a monomer of the electrically conductive polymer among nanoparticles of an inorganic oxide aggregated and adhered on a substrate; and thereafter, irradiating light upon which the nanoparticles generate holes and simultaneously applying a constant current by controlling at least one of a current density and a current application time, thereby polymerizing the monomer through a photo electrochemical reaction.

The photo electrochemical reaction as referred to herein is in general one in which an oxidation-reduction reaction is carried out by utilizing holes and electrons generated due to a photo-excitation action, and in particular, in the case of using a dye, the photo electrochemical reaction is one in which an oxidation reaction is carried out by utilizing holes generated in a photo-excited state. Here, the photo electrochemical reaction is corresponding to the polymerization reaction from the monomer of the electrically polymer as a p-type semiconductor into the polymer while utilizing holes generated by the inorganic oxide nanoparticles as an n-type semiconductor. A reaction model thereof is shown in FIG. 1.

Though in the following Examples, $TiO_2$ was used as the nanoparticles of the inorganic oxide, as inorganic particles capable of working as an n-type semiconductor, tin oxide, indium oxide, zinc oxide, iron oxide, gallium oxide, tantalum oxide, tungsten oxide, cadmium oxide, silver oxide, manganese oxide, copper oxide, vanadium oxide, niobium oxide, copper indium oxide, silver indium oxide, gallium nitride or compounds thereof, and also perovskite type oxides, copper indium oxide, silver indium oxide, gallium nitride or compounds thereof may also be used.

Also, though in the following Example, pyrrole was used as the monomer constituting the electrically conductive polymer, in addition to the above, at least one member selected from the group consisting of anilines, thiophenes, pyrroles, furans, phenylenes, phenylene vinylenes, acenes, thiophene vinylenes and isothianaphthenes may be used.

Also, though tetraethylammonium p-toluenesulfonate ($Et_4NPTS$) was exemplified below as an electrolyte, in place of this, at least member selected from the group consisting of a camphor sulfonic acid anion, a halide anion, a perchloric acid ion, a tetrafluoroboric acid ion, a hexafluoroarsenic acid ion, a sulfuric acid ion, a nitric acid ion, a thiocyanic acid ion, a hexafluorosilicic acid ion, a phosphoric acid based ion, an alkyl benzenesulfonate, an alkyl sulfonate ion, a polyacrylic acid ion, a polyvinylsulfonic acid ion, a polystyrenesulfonic acid ion and a poly(2-acrylamide-2-methylpropanesulfonic acid) ion may be used.

In the case of producing the hetero pn junction semiconductor of the present invention, first of all, for example, a slurry obtaining by dispersing the nanoparticles of the inorganic oxide as an n-type semiconductor in a dispersion medium is coated on a glass substrate by a coating method or the like.

Subsequently, the glass substrate having the slurry coated thereon is thermally treated, thereby aggregating and adhering the nanoparticles of the inorganic oxide.

Thereafter, the coated substrate is dipped in an electrolyte to allow it to react by a photo electrochemical polymerization method. As to the electrolyte, the monomer of the electrically conductive polymer and a supporting salt are incorporated into a solvent. As the irradiation light, light having a wavelength and an intensity such that the nanoparticles of the inorganic oxide generate holes is used. In the following Examples, ultraviolet light having a wavelength of 365 nm and an irradiation light intensity of 50 $mW/cm^2$ was used. Though a current density and a current application time of the current to be applied are adequately set according to values of the both, in the following Examples using titanium oxide as the nanoparticles of the inorganic oxide and pyrrole (Py) as the monomer, the current density was set from $1.27 \times 10^{-2}$ to 1.27 $A/m^2$, and the current application time was set from 10 minutes to 2 hours.

In the foregoing way, the desired hetero pn junction semiconductor can be obtained.

EXAMPLE 1

Experiments Nos. 1 to 10

For the preparation of a hetero pn junction film, the photo electrochemical polymerization (hereinafter referred to as "PEP") method was adopted.

First of all, a slurry shown in Table 1 was coated in a coating amount of 0.1 ($mL/cm^2$) on the surface of an FTO (fluorine-doped tin oxide) glass substrate by a coating method. This slurry is one in which nanoparticles of anatase phase titanium oxide having 20 nm in an average size of primary particle and an electrical conductivity an of 1.25 ($\times 10^{-5} \Omega^{-1} \cdot cm^{-1}$) was dispersed in a content of 0.2 (g/mL) with nitric acid as a dispersion medium.

After coating, the resultant was heated to 723 (K) at a heating rate of 15 (K/min) and then thermally treated for 30 minutes, thereby aggregating on the substrate in a particle apparent density of 0.25 ($g/cm^3$).

Subsequently, this coated substrate was dipped in an electrolyte shown in Table 1, thereby executing PEP. As to the electrolyte, pyrrole having a concentration of 0.1 ($mol/dm^3$) was used as a monomer; tetraethylammonium p-toluenesulfonate ($Et_4NPTS$) having a concentration of 0.1 ($mol/dm^3$) was used as a supporting salt; and water was used as a solvent. At that time, a platinum plate was used as a counter electrode, and (Ag/AgCl/saturated KCl) was used as a reference electrode.

Potentiodynamic polarization measurement (scanning range: −1.0 to 1.5 V, scan rate: 25 mV/min) under light irradiation using a high pressure ultraviolet lamp (wavelength: 365 (nm) [strongest line], irradiation light intensity: 50 (mW/$cm^2$)) and galvanostatic anodic polarization measurement under a constant current density ($1.27 \times 10^{-2}$~1.27 $A/m^2$) were carried out.

Also, as to the prepared specimen, observation of a surface and a section by an optical microscope (OM) and a scanning electron microscope (SEM) was carried out.

Characteristics thereof were measured in the following ways.

The particle diameter was measured by using X-ray diffraction measurement, laser diffraction particle diameter distribution measurement and a Coulter counter.

Figure 5:
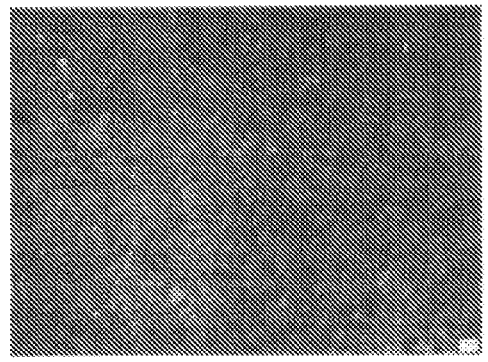
FIG. 5 is a photograph of specimen surface by an optical microscope in Experiment No. 1 (at $1.27 \times 10^{-2}$ A/m$^2$ for 1.0 hour).
Figure 5:
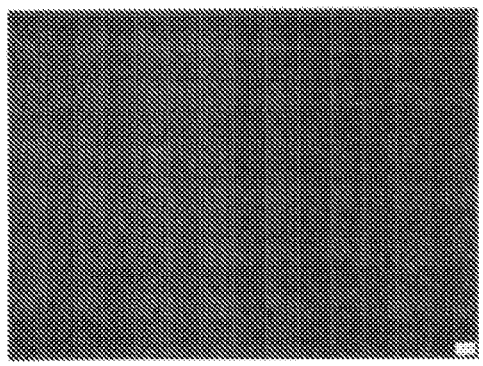
Figure 5:
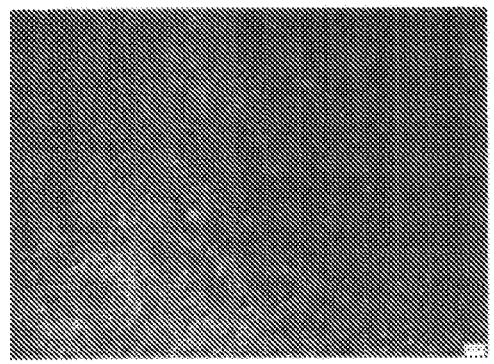
Figure 6:
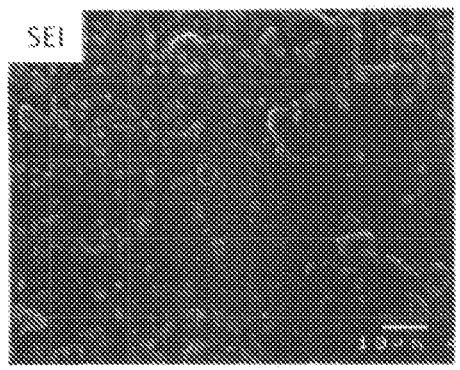
FIG. 6 is an image of specimen surface by scanning electron microscope in Experiment No. 1 (at $1.27 \times 10^{-2}$ A/m$^2$ for 1.0 hour).
Figure 6:
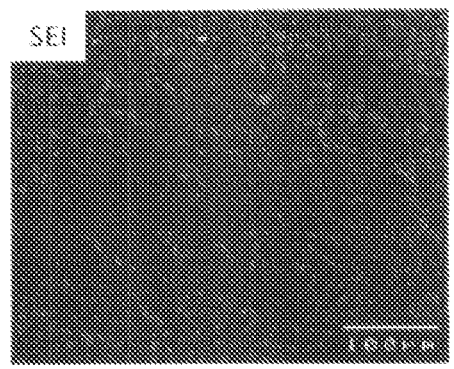
Figure 6:
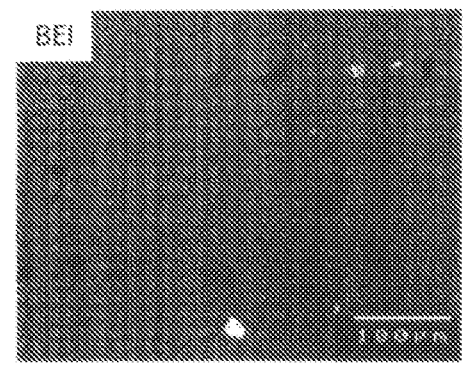

The particle (apparent) density was determined by using sectional image analysis, a mercury porosimeter, a pycnometer and weight and thickness measurements. Incidentally, Experiments Nos. 6 and 8 to 10 of Table 1 are comparative examples for the purpose of clarifying the present invention.

blackened. Also, photographs of the surface of the same specimen by an optical microscope are shown in FIGS. 5a to 5c. It is noted that in the foregoing blackened portion, a white portion by titanium oxide and a black portion by polypyrrole coexist. Scanning electron microscopic photographs of the surface of the same specimen are shown in FIGS. 6a to 6c. FIG. 6b is a secondary electron image, and FIG. 6c is a reflective electron image. It is noted that the black portion by

TABLE 1

| | Experiment No. | 1 | 2 | 3 | 4 | 5 | 6 | 7 | 8 | 9 | 10 |
|---|---|---|---|---|---|---|---|---|---|---|---|
| Nanoparticle | Primary particle diameter (nm) | 20 | " | " | " | " | " | " | " | " | " |
| | Material | $TiO_2$* | " | " | " | " | " | " | " | " | " |
| | *σn | 1.25 | " | " | " | " | " | " | " | " | " |
| Slurry | Dispersion medium | Nitric acid | " | " | " | " | " | " | " | " | " |
| | NP* (g/mL) | 0.2 | " | " | " | " | " | " | " | " | " |
| | Coating amount (mL/cm$^2$) | 0.1 | " | " | " | " | " | " | " | " | " |
| Thermal treatment | Treatment temperature (K) | 723 | " | " | " | " | " | " | " | " | " |
| | Heating rate (K/min) | 15 | " | " | " | " | " | " | " | " | " |
| | Treatment time (hr) | ½ | " | " | " | " | " | " | " | " | " |
| | Particle apparent density (g/cm$^3$) | 0.25 | " | " | " | " | " | " | " | " | " |
| Electrolyte | (1) Material | PY | " | " | " | " | " | " | " | " | " |
| | Concentration* | 0.1 | " | " | " | " | " | " | " | " | " |
| | (2) Material | $Et_4NPTS$ | " | " | " | " | " | " | " | " | " |
| | Concentration* | 0.1 | " | " | " | " | " | " | " | " | " |
| | Solvent | Water | " | " | " | " | " | " | " | " | " |
| PEP | Irradiation light wavelength (nm: strongest line) | 365 | " | " | " | " | " | " | " | " | " |
| | Irradiation light intensity (mW/cm$^2$) | 50 | " | " | " | " | " | " | " | " | " |
| | Current density ($\times 10^{-1}$ A/m$^2$) | 0.127 | 0.127 | 0.127 | 1.27 | 1.27 | 1.27 | 6.35 | 12.7 | 12.7 | 12.7 |
| | Treatment time (hr) | 1 | 1 + ½ | 2 | ⅙ | 1 | 1 + ½ | ⅙ | ⅙ | ½ | 1 |
| Prepared film | (3) Material | PP | " | " | " | " | " | " | " | " | " |
| | *σp | 1.98 | " | " | " | " | " | " | " | " | " |
| | Particle apparent density (g/cm3) | 0.125 | " | " | " | " | " | " | " | " | " |
| | Contact area (%) | 6.3 | 9.5 | 12.6 | 10 | 63 | 95 | 50 | 100 | 100 | 100 |
| | *X | 0.74 | 1.11 | 1.48 | 1.18 | 7.4 | 11.1 | 5.9 | 11.8 | 37 | 74 |

NP*: Nanoparticle content
Each of *σn, *σp and *X is algebra in the Equation 1, and each of the units of *σn and *σp is ($\times 10^{-5} \Omega^{-1} \cdot cm^{-1}$).
(1) Monomer
(2) Supporting salt
(3) Electrically conductive polymer
$TiO_2$*: $TiO_2$ anatase phase
$Et_4NPTS$: Tetraethylammonium p-toluenesulfonate
UVL: Light by high pressure ultraviolet lamp
PY: Pyrrole
PP: Polypyrrole
Concentration*: The unit is (mol/dm$^3$)

Polarization Curve Under Light Irradiation

Figure 2:
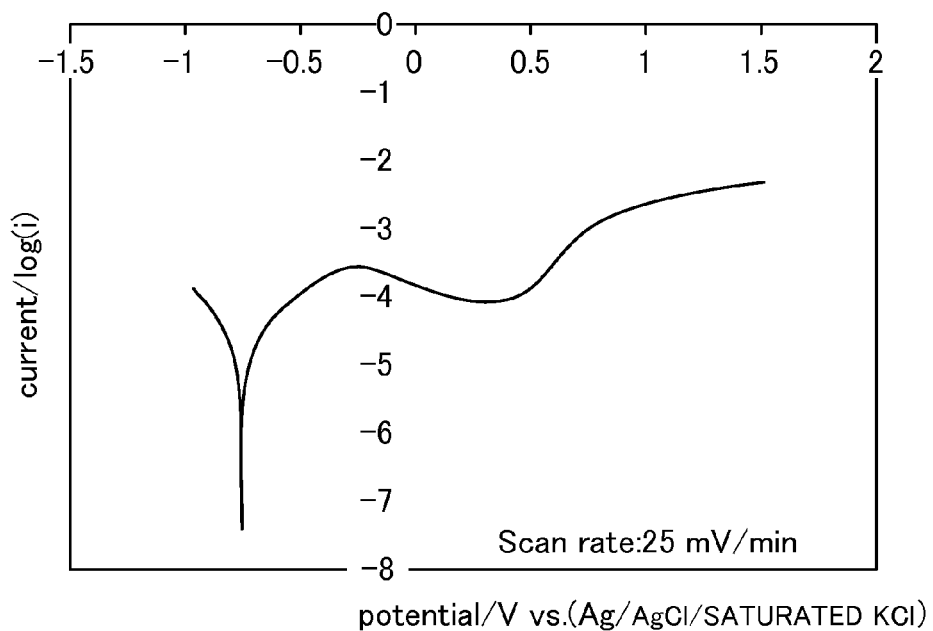
FIG. 2 is a polarization curve under light irradiation.

A polarization curve under light irradiation as examined by the preliminary experiment is shown in FIG. 2. It is noted from this that the oxidation current increases at two stages in the vicinity of −0.8 V and in the vicinity of 0.5 V. It may be considered that the increase of the oxidation current from −0.8 V was caused due to the fact that electrons were supplied from the monomer into holes generated by electron excitation by light in titanium oxide. On the other hand, it may be considered that the increase of the oxidation current from 0.5 V was caused due to progress of the oxidative polymerization of polypyrrole on the substrate.

Galvanostatic Anodic Polarization

Figure 3:
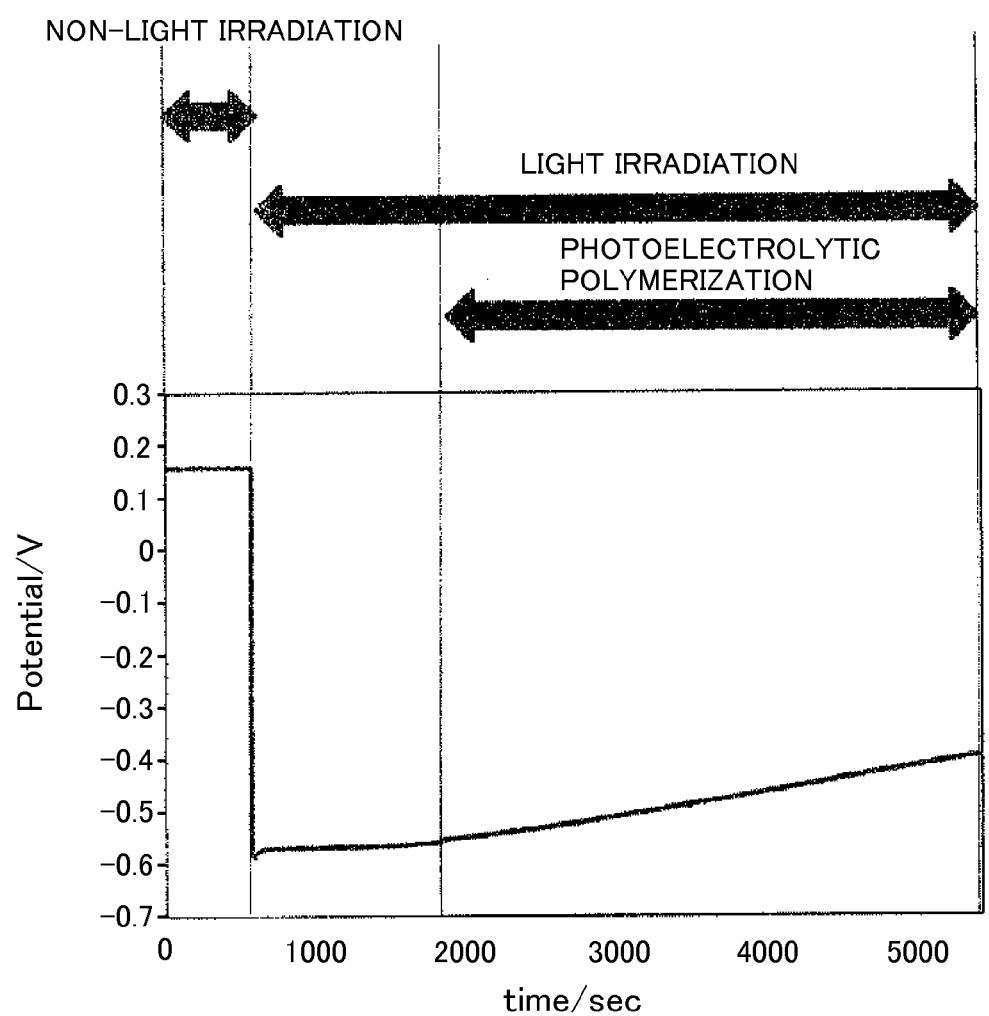
FIG. 3 shows a change in potential with time while performing non-light irradiation→light irradiation→light irradiation+current application in Experiment No. 1 (at $1.27 \times 10^{-2}$ A/m$^2$ for 1.0 hour).
Figure 4:
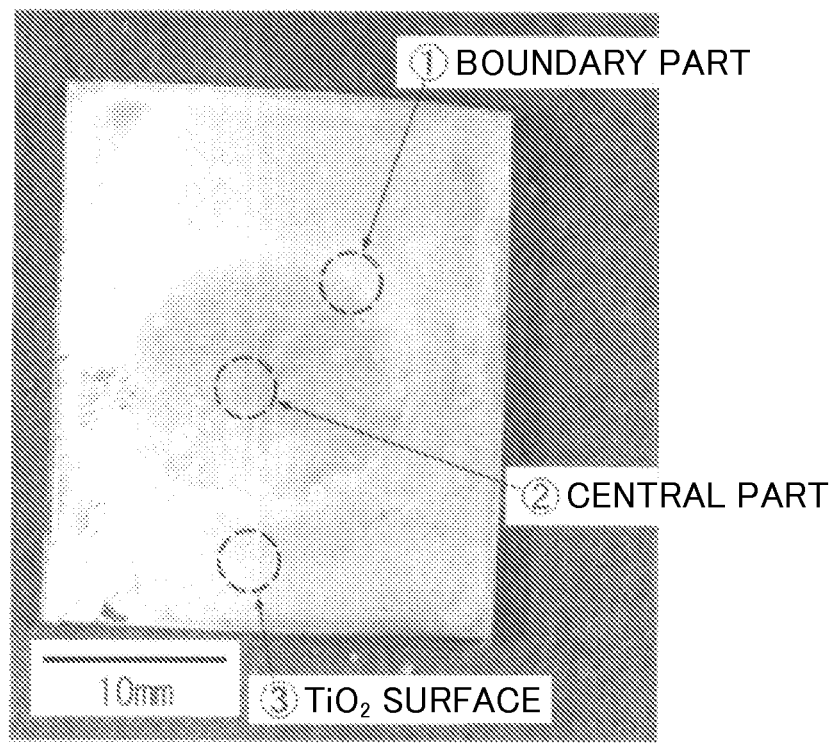
FIG. 4 is an appearance of specimen after the experiment in Experiment No. 1 (at $1.27 \times 10^{-2}$ A/m$^2$ for 1.0 hour).
Figure 7:
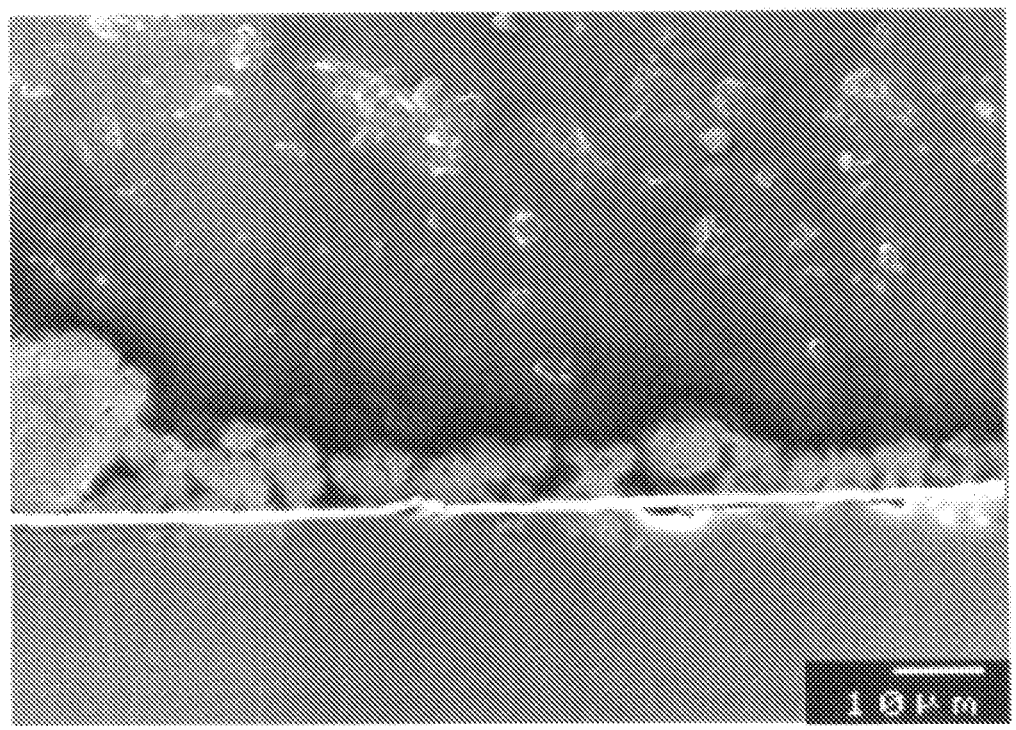
FIG. 7 is a cross-sectional image of specimen by scanning electron microscope in Experiment No. 1 (at $1.27 \times 10^{-2}$ A/m$^2$ for 1.0 hour).

Changes with time of an immersion potential under non-light irradiation and light irradiation and a potential under galvanostatic polarization (at a current density of $1.27 \times 10^{-2}$ A/m$^2$ for one hour (Experiment No. 1)) are shown in FIG. 3. An appearance of the specimen after the polarization is shown in FIG. 4. It is noted that the specimen surface is slightly polypyrrole is localized. Scanning electroscopic photographs of the section of the same specimen are shown in FIG. 7. It is noted that voids which appear gray are present among white titanium oxides, and black polypyrrole is formed in a part thereof.

The prepared film of Experiment No. 1 had σp of 1.98 ($\times 10^{-5} \Omega^{-1} \cdot cm^{-1}$), a particle apparent density of 0.125 (g/cm$^3$), X of 0.74 and a contact area of 6.3%. This example satisfies the range of X in the foregoing equation, and a hetero pn junction film having an excellent photoelectric conversion performance was obtained without using a dye.

Figure 8:
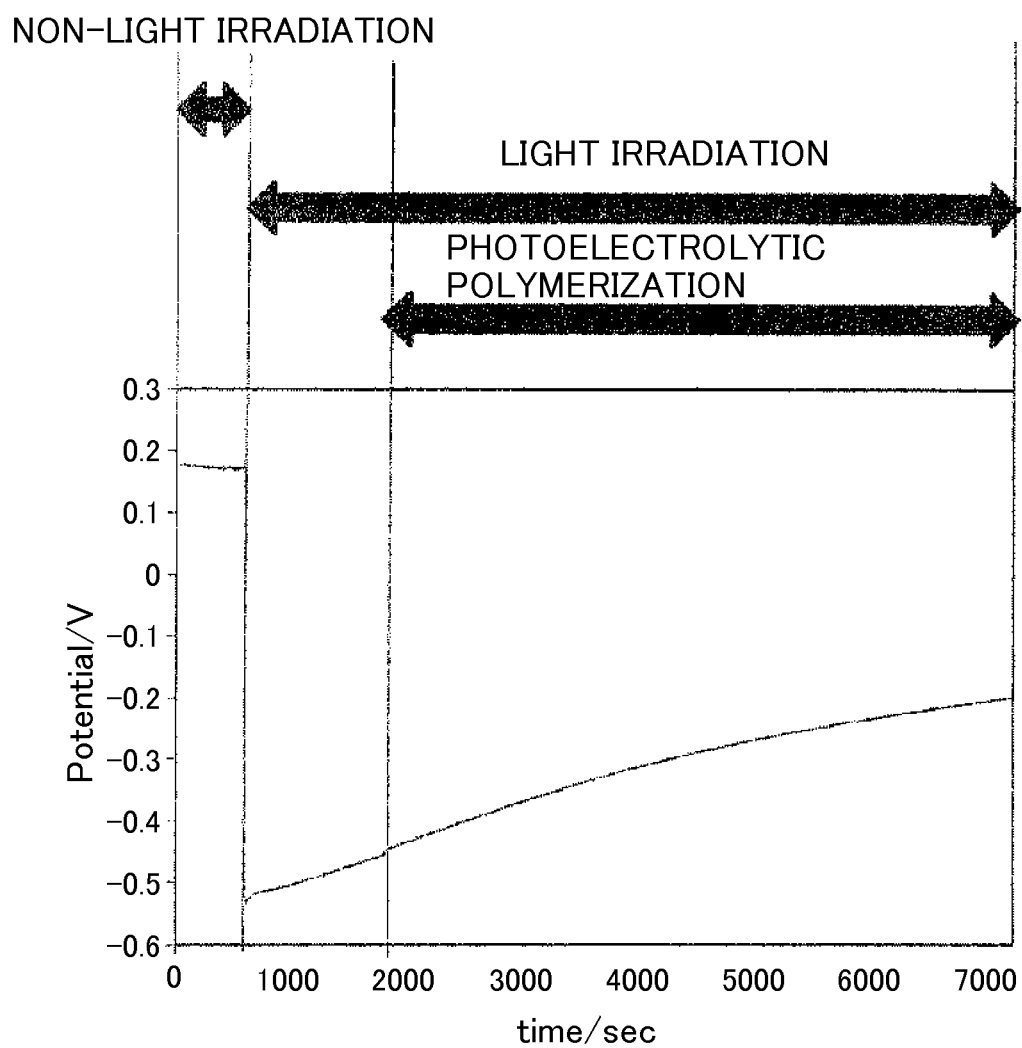
FIG. 8 shows a change in potential with time while performing non-light irradiation→light irradiation→light irradiation+current application in Experiment No. 2 (at $1.27 \times 10^{-2}$ A/m$^2$ for 1.5 hours).
Figure 9:
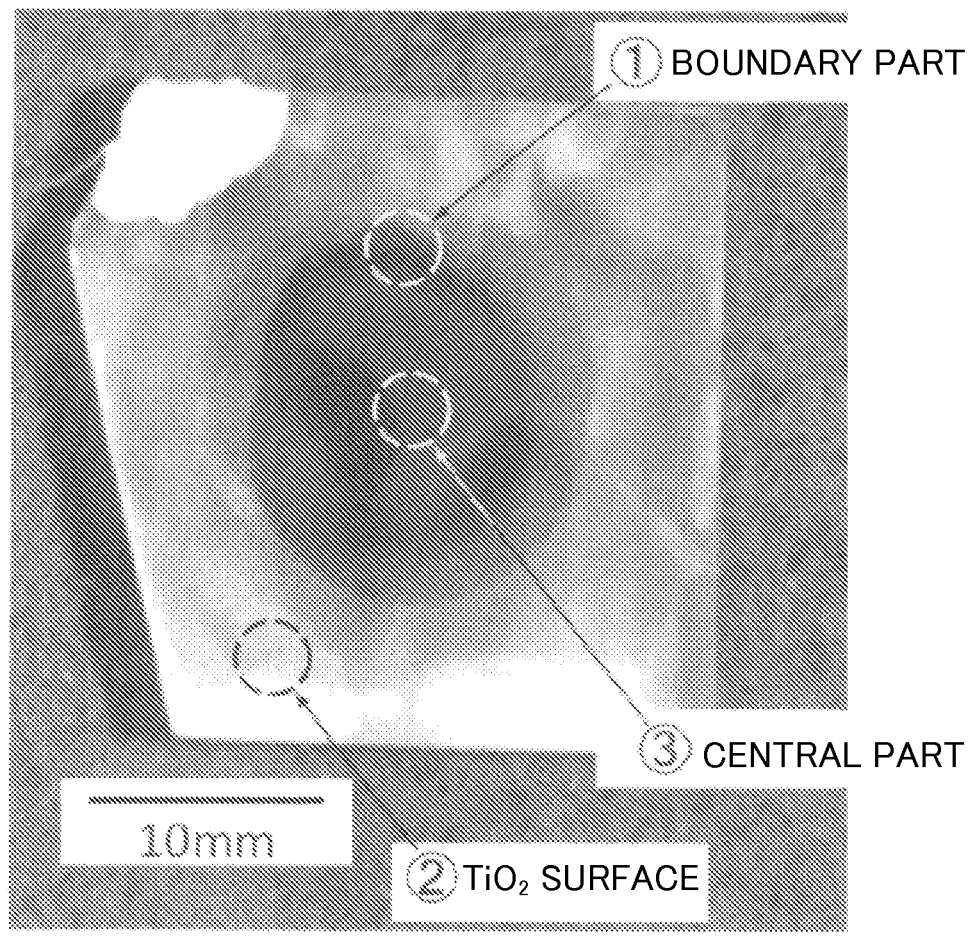
FIG. 9 is an appearance of specimen after the experiment in Experiment No. 2 (at $1.27 \times 10^{-2}$ A/m$^2$ for 1.5 hours).
Figure 10:
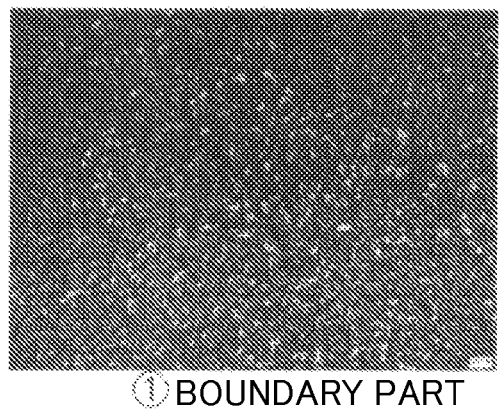
FIG. 10 is a photograph of specimen surface by an optical microscope in Experiment No. 2 (at $1.27 \times 10^{-2}$ A/m$^2$ for 1.5 hours).
Figure 10:
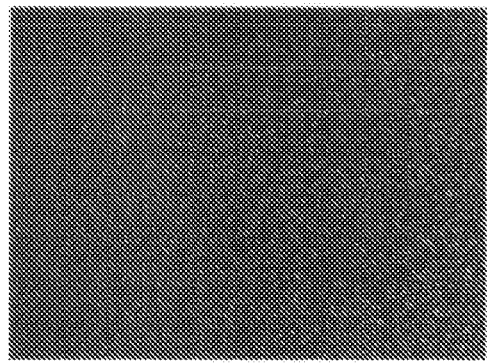
Figure 10:
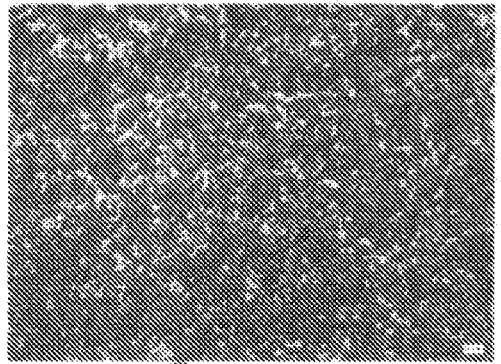
Figure 11:
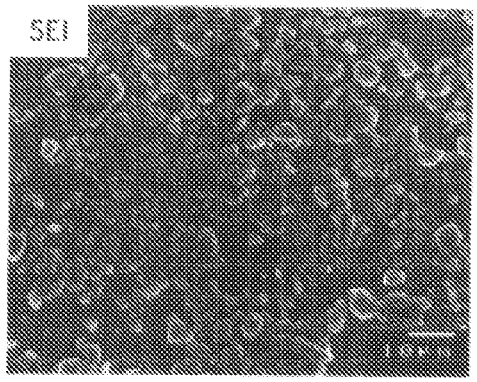
FIG. 11 is an image of specimen surface by scanning electron microscope in Experiment No. 2 (at $1.27 \times 10^{-2}$ A/m$^2$ for 1.5 hours).
Figure 11:
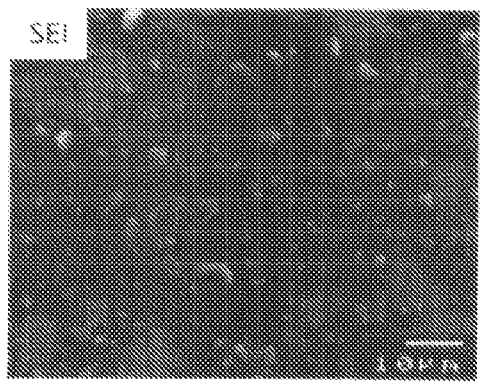
Figure 11:
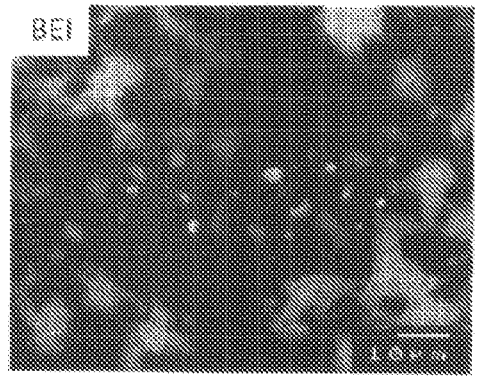
Figure 12:
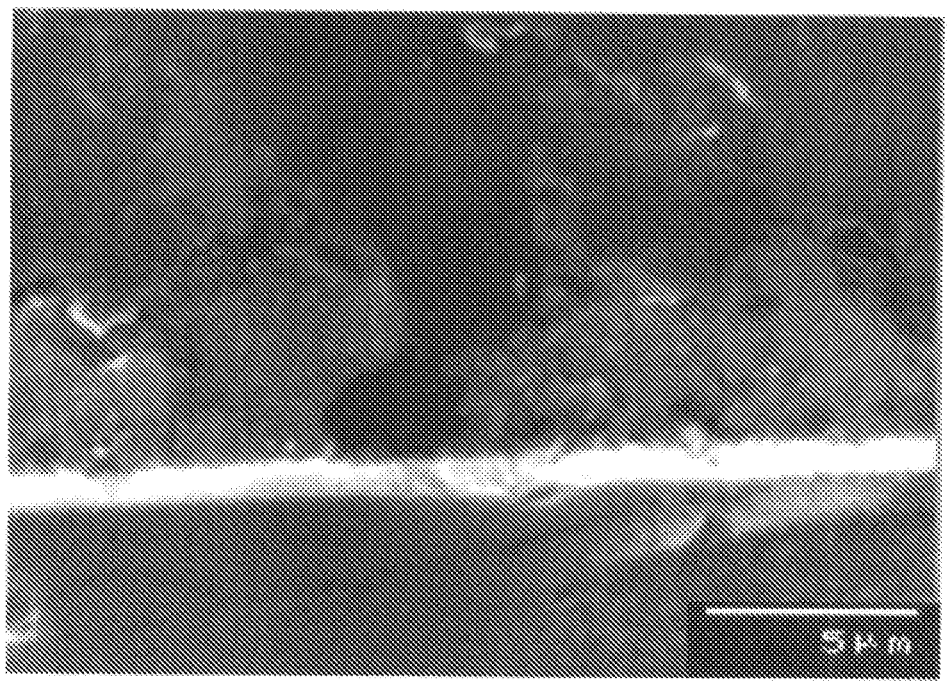
FIG. 12 is a cross-sectional image by scanning electron microscope in Experiment No. 2 (at $1.27 \times 10^{-2}$ A/m$^2$ for 1.5 hours).

Changes with time of an immersion potential under non-light irradiation and light irradiation and a potential under galvanostatic polarization (at a current density of $1.27 \times 10^{-2}$ A/m$^2$ for 1.5 hours (Experiment No. 2)) are shown in FIG. 8. An appearance of the specimen after the polarization is shown in FIG. 9. It is noted that a blackened portion of the specimen surface increases as compared with that in FIG. 4. Also, photographs of the surface of the same specimen by an optical microscope are shown in FIGS. 10a to 10c. It is noted that in the foregoing blackened portion, a white portion by titanium oxide and a black portion by polypyrrole coexist. Scanning electron microscopic images of the surface of the same specimen are shown in FIGS. 11a to 11c. It is noted that the black portion by polypyrrole increases as compared with that in FIG. 6c. Scanning electroscopic photographs of the section of the same specimen are shown in FIG. 12. It is noted that voids which appear gray are present among white titanium oxides, and black polypyrrole is formed in a part thereof. It is noted that the black area increases as compared with that in FIG. 7.

The prepared film of Experiment No. 2 had σp of 1.98 ($\times 10^{-5} \Omega^{-1} \cdot cm^{-1}$), a particle apparent density of 0.125 (g/cm$^3$), X of 1.11 and a contact area of 9.5%.

Figure 13:
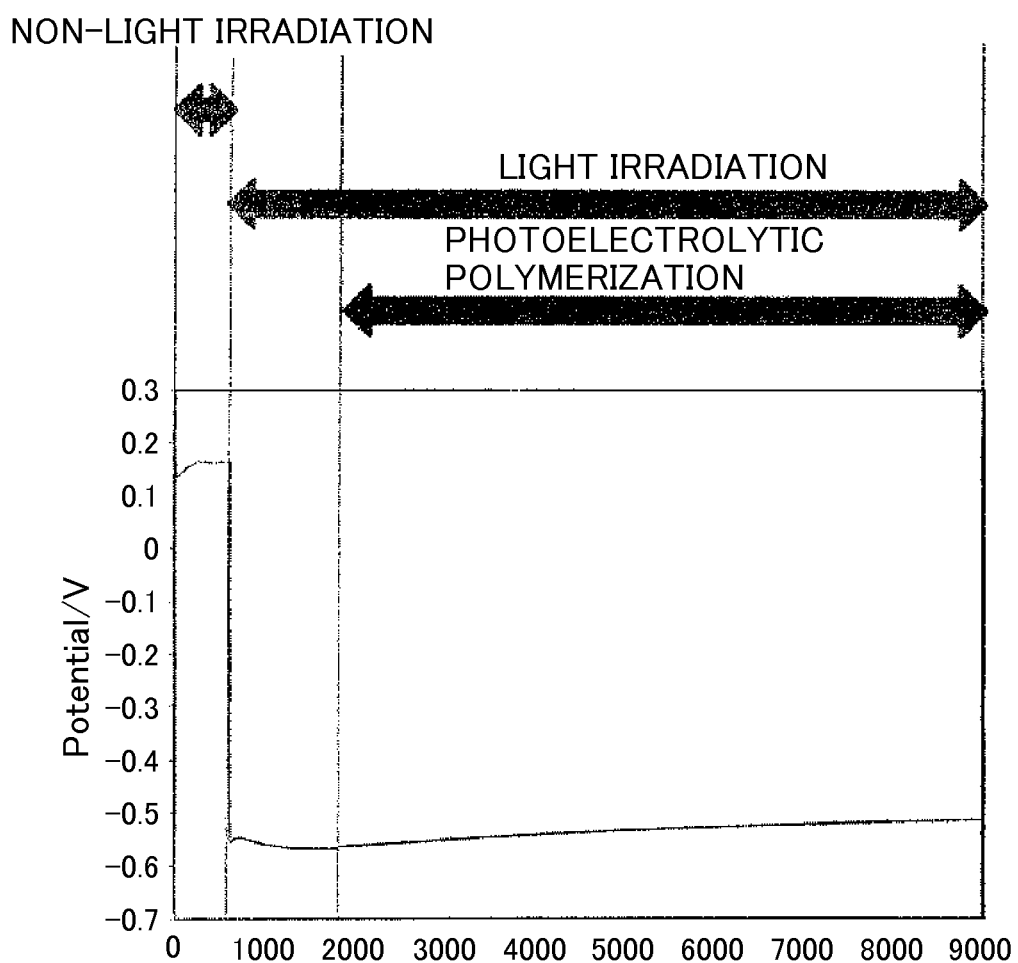
FIG. 13 shows a change in potential with time while performing non-light irradiation→light irradiation→light irradiation+current application in Experiment No. 3 (at $1.27 \times 10^{-2}$ A/m$^2$ for 2.0 hours).
Figure 14:
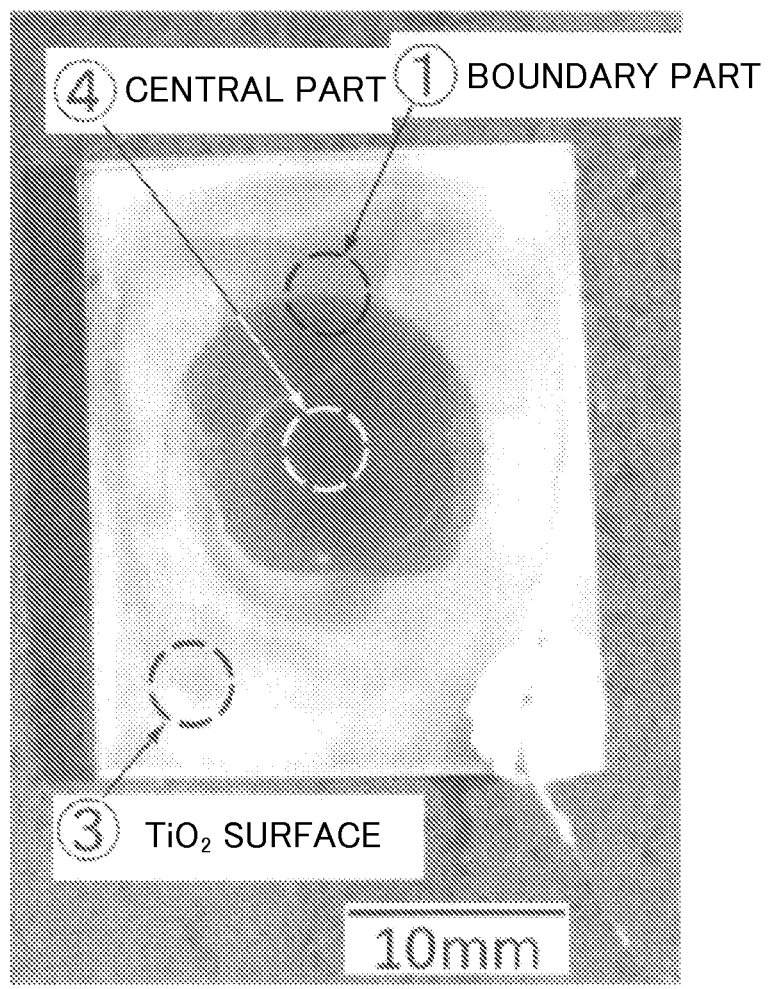
FIG. 14 is an appearance of specimen after the experiment in Experiment No. 3 (at $1.27 \times 10^{-2}$ A/m$^2$ for 2.0 hours).
Figure 15:
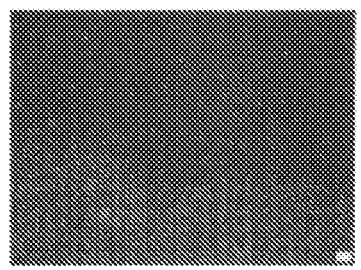
FIG. 15 shows a change in potential with a constant current to flow in Experiment No. 3 (at $1.27 \times 10^{-2}$ A/m$^2$ for 2.0 hours).
Figure 15:
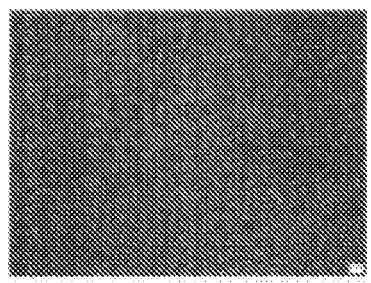
Figure 15:
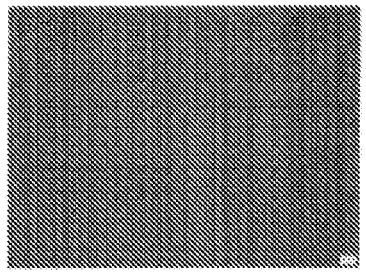
Figure 16:
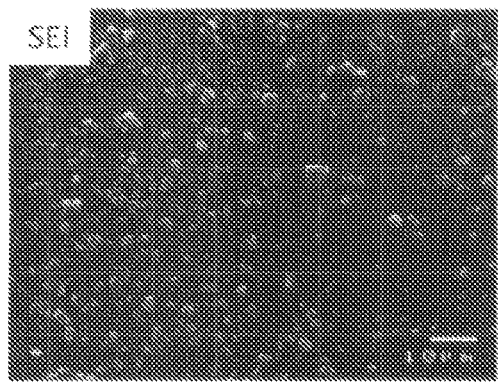
FIG. 16 is an image of specimen surface by scanning electron microscope in Experiment No. 3 (at $1.27 \times 10^{-2}$ A/m$^2$ for 2.0 hours).
Figure 16:
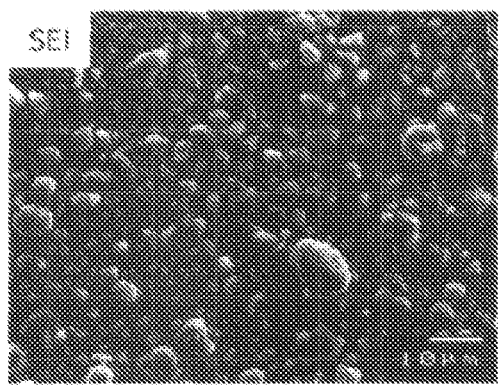
Figure 16:
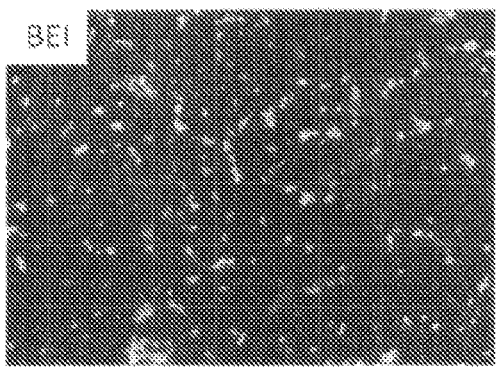
Figure 17:
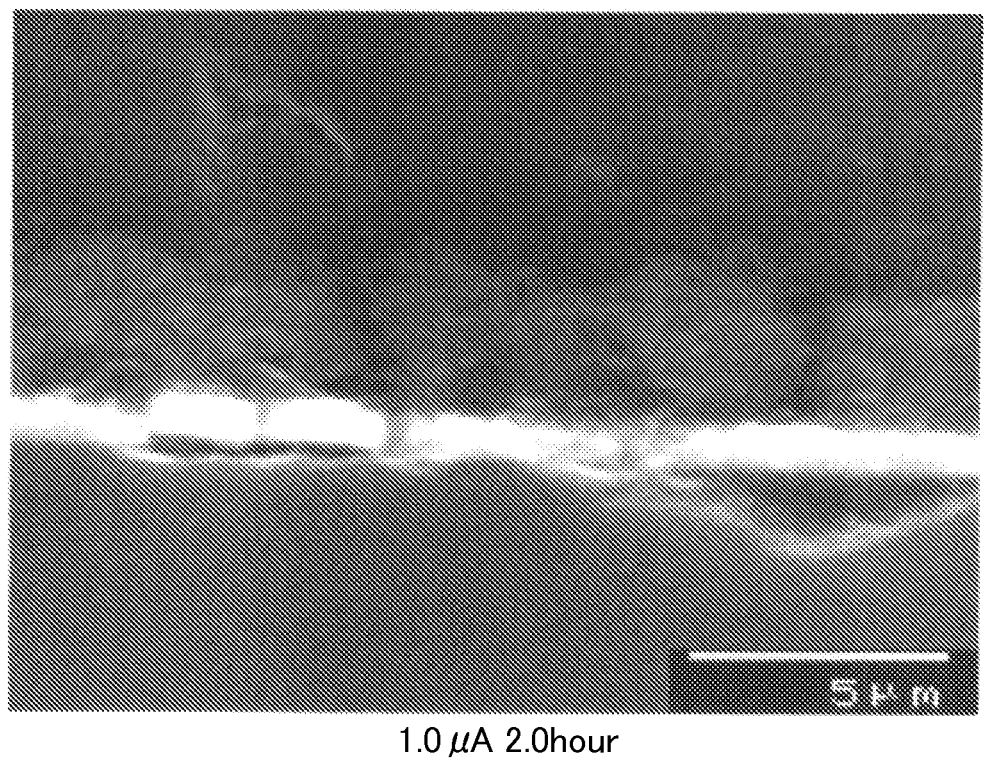
FIG. 17 is a cross-sectional image by scanning electron microscope in Experiment No. 3 (at $1.27 \times 10^{-2}$ A/m$^2$ for 2.0 hours).

Changes with time of an immersion potential under non-light irradiation and light irradiation and a potential under galvanostatic polarization (at a current density of $1.27 \times 10^{-2}$ A/m$^2$ for 2.0 hours (Experiment No. 3)) are shown in FIG. 13. An appearance of the specimen after the polarization is shown in FIG. 14. It is noted that a blackened portion of the specimen surface increases as compared with that in FIG. 9. Also, photographs of the surface of the same specimen by an optical microscope are shown in FIGS. 15a to 15c. It is noted that in the foregoing blackened portion, a white portion by titanium oxide and a black portion by polypyrrole coexist. Scanning electron microscopic photographs of the surface of the same specimen are shown in FIGS. 16a to 16c. It is noted that the black portion by polypyrrole increases as compared with that in FIG. 11c. Scanning electroscopic photographs of the section of the same specimen are shown in FIG. 17. It is noted that voids which appear gray are present among white titanium oxides, and black polypyrrole is formed in a part thereof. It is noted that the black area increases as compared with that in FIG. 12.

The prepared film of Experiment No. 3 had σp of 1.98 ($\times 10^{-5} \Omega^{-1} \cdot cm^{-1}$), a particle apparent density of 0.125 (g/cm$^3$), X of 1.48 and a contact area of 12.6%.

Figure 18:
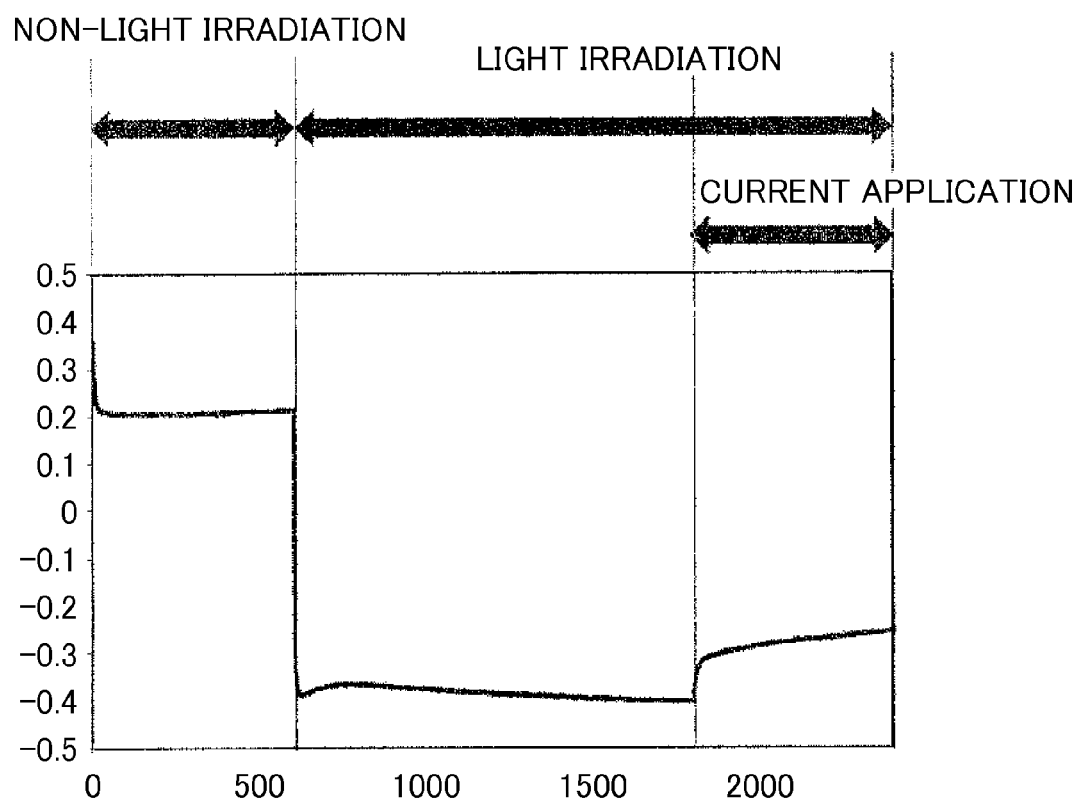
FIG. 18 shows a change in potential with time while performing non-light irradiation→light irradiation→light irradiation+current application in Experiment No. 8 (at 1.27 A/m$^2$ for 10 minutes).
Figure 19:
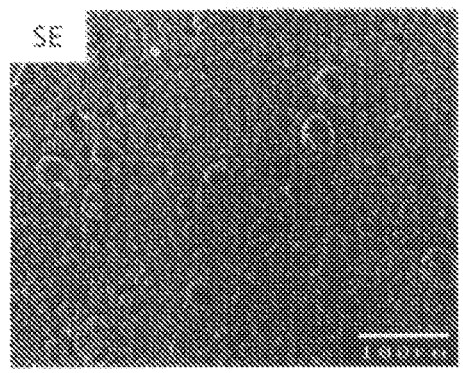
FIG. 19 is an image of specimen surface by scanning electron microscope in Experiment No. 8 (at 1.27 A/m$^2$ for 10 minutes).
Figure 19:
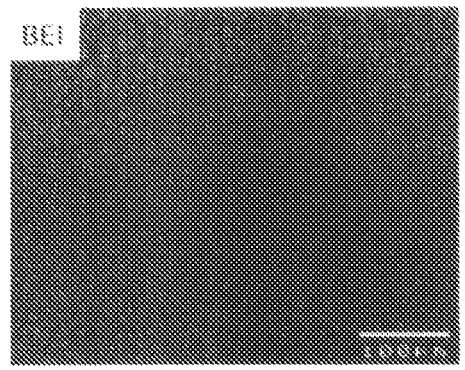

Changes with time of an immersion potential under non-light irradiation and light irradiation and a potential under galvanostatic polarization (at a current density of 1.27 A/m$^2$ for 10 minutes (Experiment No. 4)) are shown in FIG. 18. Scanning electron microscopic photographs of the surface of the specimen surface after the polarization are shown in FIGS. 19a to 19b. It is noted that the black portion by polypyrrole increases as compared with that in FIG. 16c, and almost all portions are covered black (for example, FIG. 19b).

The prepared film of Experiment No. 4 had σp of 1.98 ($\times 10^{-5} \Omega^{-1} \cdot cm^{-1}$), a particle apparent density of 0.125 (g/cm$^3$), X of 1.18 and a contact area of 10%.

Figure 20:
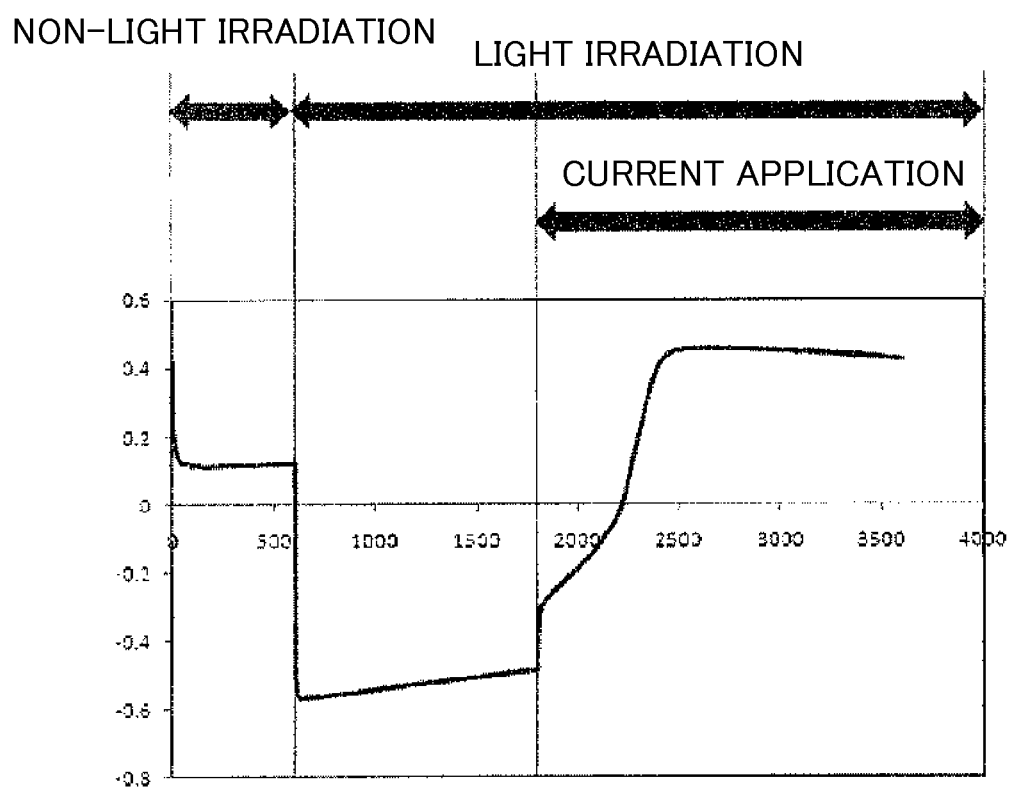
FIG. 20 shows a change in potential with time while performing non-light irradiation→light irradiation→light irradiation+current application in Experiment No. 9 (at 1.27 A/m$^2$ for 30 minutes).

Incidentally, in the case where the current density is 1.27 A/m$^2$, after a gradual increase of the polarization potential to around −0.2 V, the potential rapidly increased to around 0.5 V and became almost constant (FIG. 20). Also, in the specimen after the polarization, deposition of polypyrrole was observed in the vicinity of the substrate. When combined with the results of the polarization curve, it may be considered that the formation of pyrrole proceeded on titanium oxide around −0.2 V and on the substrate at 0.5 V, respectively.

The preparation of polypyrrole by a photo electrochemical polymerization method using a substrate having a titanium oxide film prepared on an FTO glass was investigated. As a result, it became clear that the deposition of polypyrrole on titanium oxide depends upon its potential. Also, it was noted that the growth process depends upon the current density and the current impression time.

As to the prepared films of Experiments Nos. 5 to 10, observation and measurement were carried out in the same ways as those described above. Values of X and the contact area were those shown in Table 1.

EXAMPLE 2

The electrochemical measurement was carried out using a three-electrode cell having an open window for installing a working electrode. The working electrode was prepared in the following manner. A suspension containing titanium oxide (anatase, 20 nm) was coated on a transparent electrically conductive oxide (TCO) glass substrate. After thermally treating at 723 K for 30 minutes, the resultant was dipped in an ethanol solution containing an Ru dye (N719) at room temperature for 24 hours. Pyrrole as a precursor of the polymer and polyethylene glycol (PEG, molecular weight: 200) containing, as a supporting salt, tetraethylammonium p-toluenesulfonate serving as a dopant were used for the electrolyte.

A platinum plate was used as a counter electrode, and an Ag/AgCl/saturated KCl solution was used as a reference electrode. In this Example, a potential of the working electrode is shown relative to a potential of a standard hydrogen electrode (SHE). Visible light was introduced from the back side of the working electrode by using a solar simulator.

Linear sweep voltammetry was carried out at a scan rate of 25 mV/min at from a immersion potential to 2.0 V. Chronopotentiometry was carried out at a current density of from 0.75 to 75 µA/cm$^2$.

Figure 21:
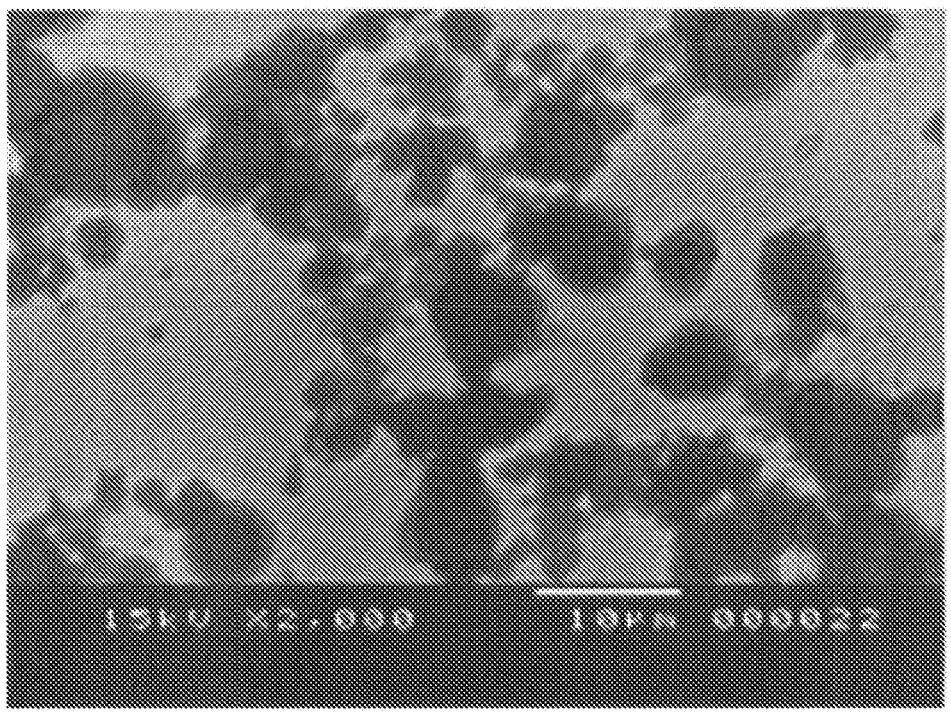
FIG. 21 is an SEM image of a specimen surface after applying current at 7.5 μA/cm$^2$ for 60 minutes in Example 2 (top: back scattering image, bottom: secondary electron image).
Figure 21:
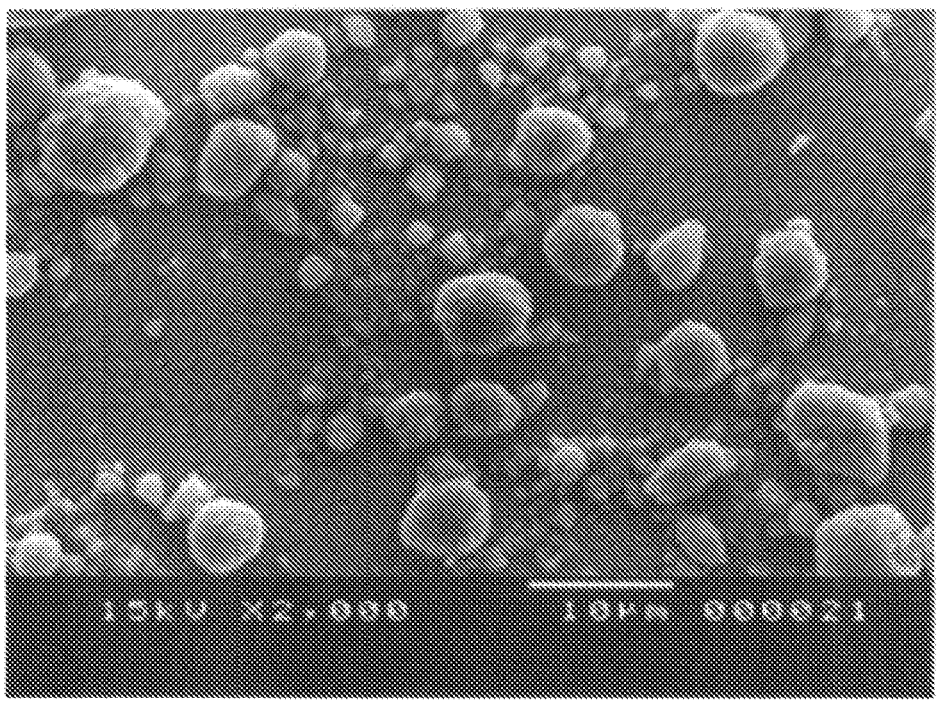
Figure 22:
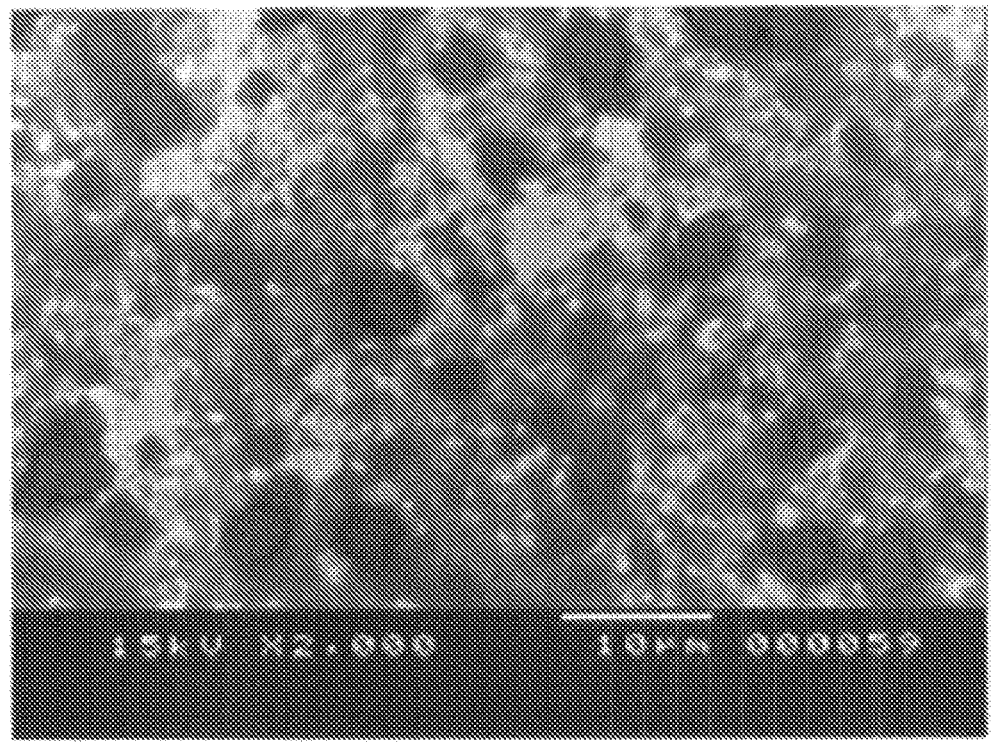
FIG. 22 is an SEM image of a specimen surface after applying current at 75 μA/cm$^2$ for 10 minutes in Example 2 (top: back scattering image, bottom: secondary electron image).
Figure 22:
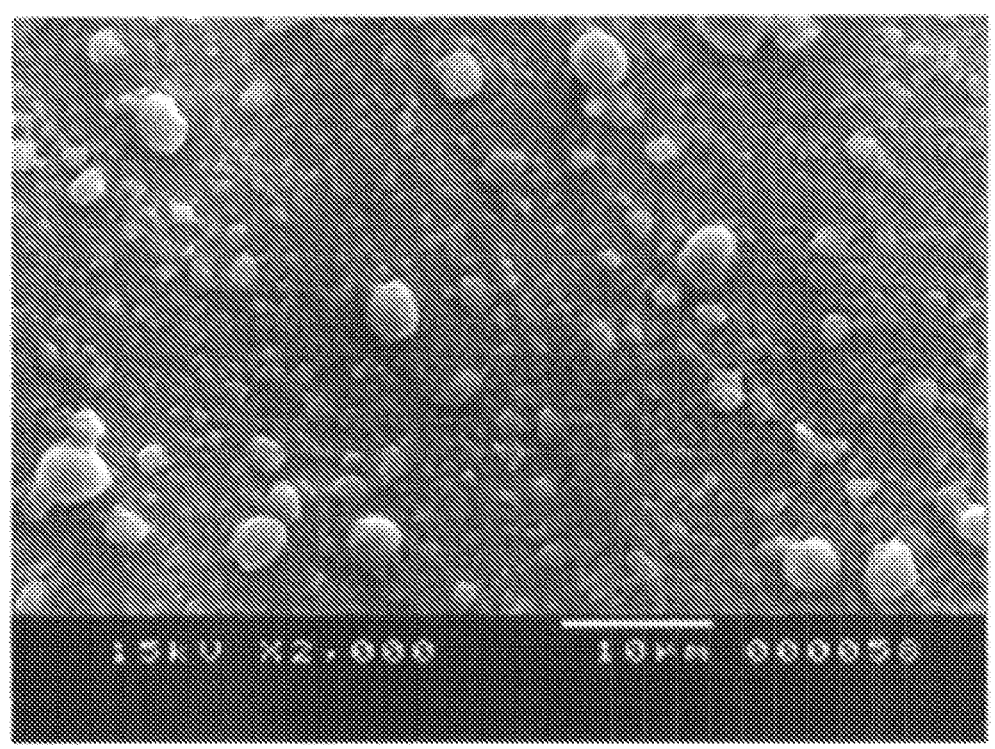
Figure 23:
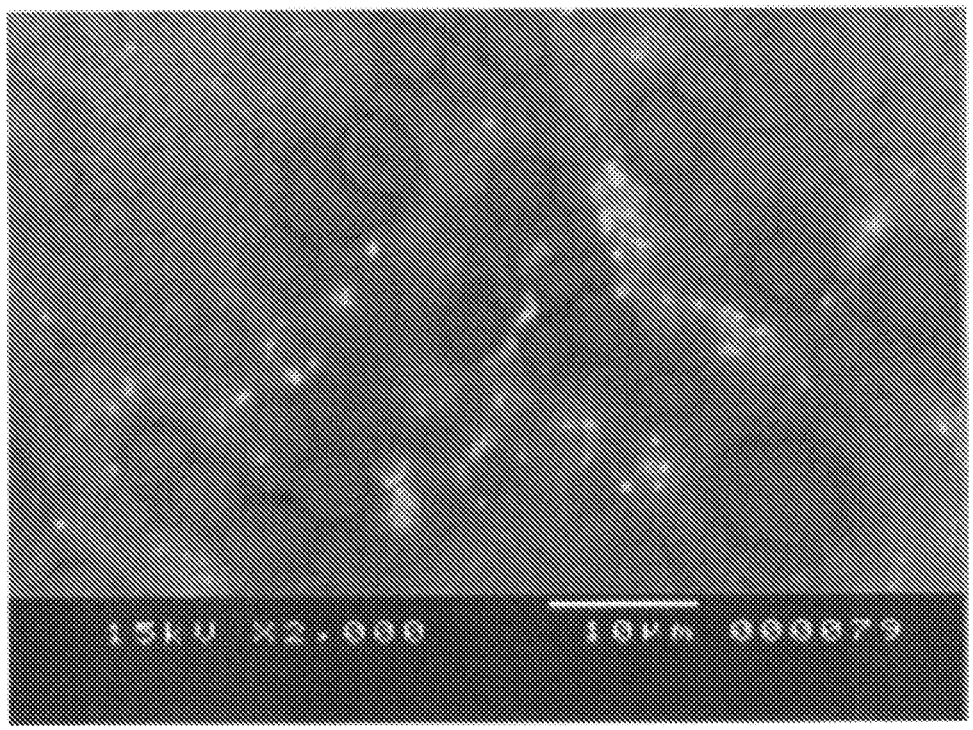
FIG. 23 is an SEM image of a specimen surface after applying current at 0.75 μA/cm$^2$ for 60 minutes in Example 2 (top: back scattering image, bottom: secondary electron image).
Figure 23:
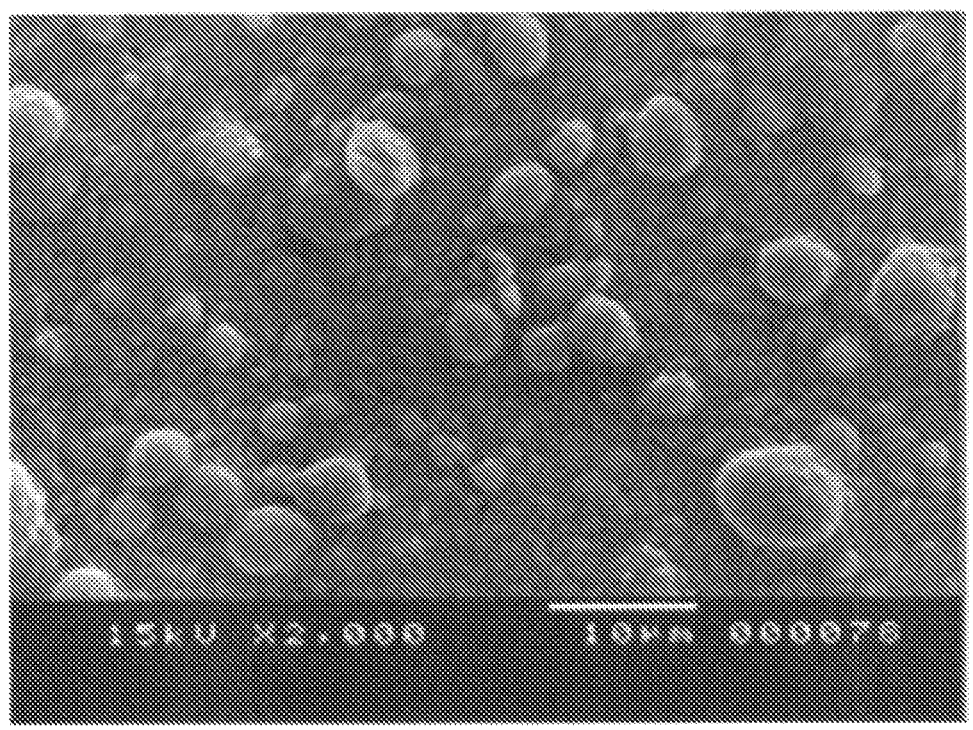

SEM was used for the surface observation of the specimen. FIG. 21 is an SEM image of a specimen after carrying out the chronopotentiometry at a current density of 0.75 µA/cm$^2$ for 60 minutes; FIG. 22 is an SEM image of a specimen after carrying out the chronopotentiometry at a current density of 7.5 µA/cm$^2$ for 60 minutes; and FIG. 23 is an SEM image of a specimen after carrying out the chronopotentiometry at a current density of 75 µA/cm$^2$ for 10 minutes.

It is noted that the larger the quantity of electricity is, the more polypyrrole (block portion on the top) increased, and the polymerization proceeds.

Figure 24:
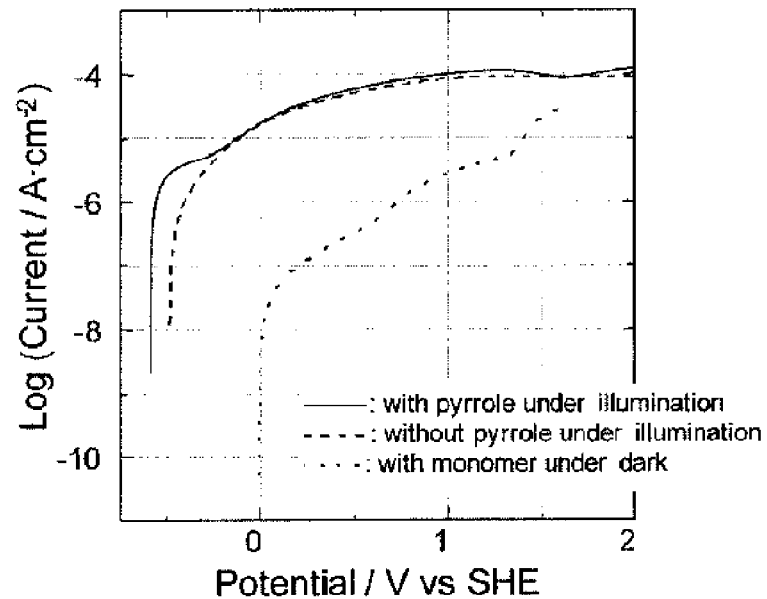
FIG. 24 is anodic polarization curves in Example 2.

Anodic polarization curves obtained under some conditions are shown in FIG. 24. The immersion potential under light irradiation was less noble than that under dark. The current (photocurrent) under light irradiation rapidly increased by slight anodic polarization from the immersion potential. It may be considered that this is caused due to the fact that holes generated by photo-excitation cause an anodic reaction.

It is noted that when the pyrrole is contained in the electrolyte, the photocurrent observed up to −0.25 V is larger than that when pyrrole is not contained. Also, it is noted that the dependency of the photocurrent upon the polarization potential is identical within the range of from −0.25 V to 1.6 V regardless of the presence or absence of pyrrole. In consequence, it may be conjectured that PEG contributes to the photoanodic reaction from −0.25 V to 1.6 V. At 1.6 V or higher, when pyrrole was not present in the electrolyte, the photocurrent exhibited a substantially constant value, whereas when pyrrole was contained, the photocurrent increased. It may be considered that this increase of the photocurrent is caused due to electrolytic oxidative polymerization of pyrrole on the TCO substrate. In actuality, an abrupt increase of the anodic current at 1.3 V or higher was observed under dark.

Figure 25:
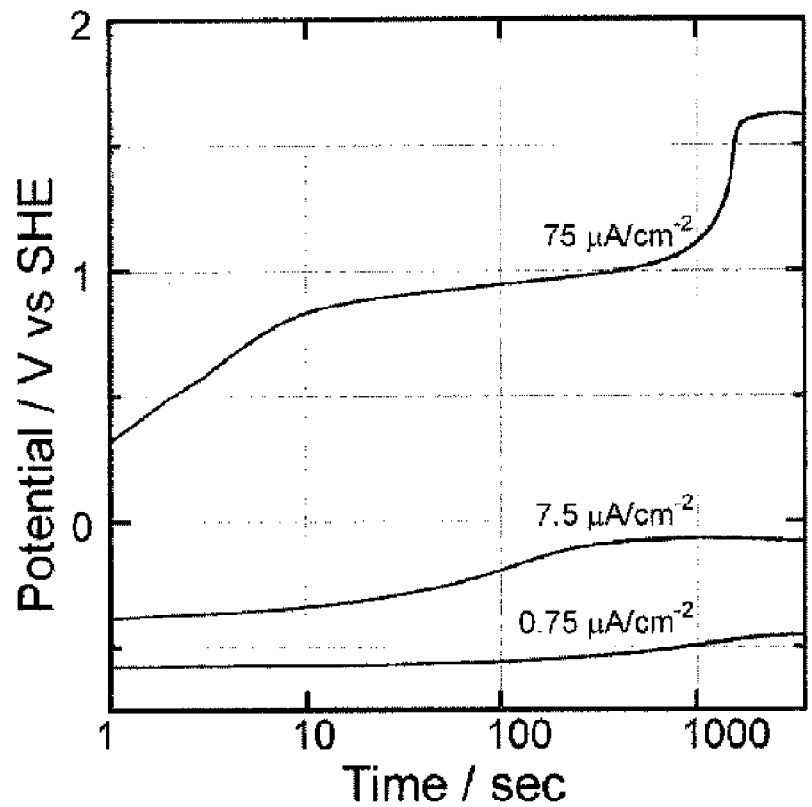
FIG. 25 is chronopotentiometric curves in Example 2.

From the results of the chronopotentiometry under the light irradiation (FIG. 25), the electrode potential increased with time at the beginning of polarization, and its duration time depended upon the current density. The presence of an organic material was confirmed on the surface of the working electrode after the polarization at 7.5 µA/cm² for one hour (FIG. 25). From these results, it may be considered that in this duration time, the polymerization of Py due to a dye sensitized photoanodic reaction proceeds. Also, after the potential increase at the beginning of polarization, two plateaus in potential were observed. It may be conjectured that in the plateau on the low potential, the anodic reaction of electrolyte by holes generated by photo-excitation proceeds, whereas in the plateau on the high potential, electrolytic oxidative polymerization proceeds on the TCO substrate.

The chronopotentiometry is hereunder described.

The chronopotentiometry as referred to herein is a technique in which a potential change is observed at the time of allowing a constant current to flow, thereby electrochemically analyzing a reaction process.

The electrode potential increases with time at the beginning of polymerization. In this time, polymerization of pyrrole by a dye sensitized photoanodic reaction proceeds.

After the potential increase at the beginning of polarization, with respect to the two plateaus in potential, in the plateau on a low potential, the anodic reaction of electrolyte by holes generated by photo-excitation proceeds, whereas in the plateau on a high potential, electrolytic oxidative polymerization proceeds on the TCO substrate.

So far, a structure of inorganic semiconductor (titanium oxide)/dye/electrically conductive polymer (polypyrrole) was reported. However, in that report, only the potential is controlled at the time of causing a photo electrochemical reaction. In view of the fact that the potential varies depending upon a site (resistance) within the structure, a current value (namely, a reaction rate) locally changes. That is, the reaction rate as referred to herein is a polymerization rate of an electrically conductive polymer, and it may be expected that polymers having various polymerization degrees are formed.

In the present invention, since the polymerization is carried out on the basis of a steady polarization (potential-current) curve while keeping the current (reaction rate) constant, it may be considered that a structure containing a more uniform electrically conductive polymer is obtained.

Figure 26:
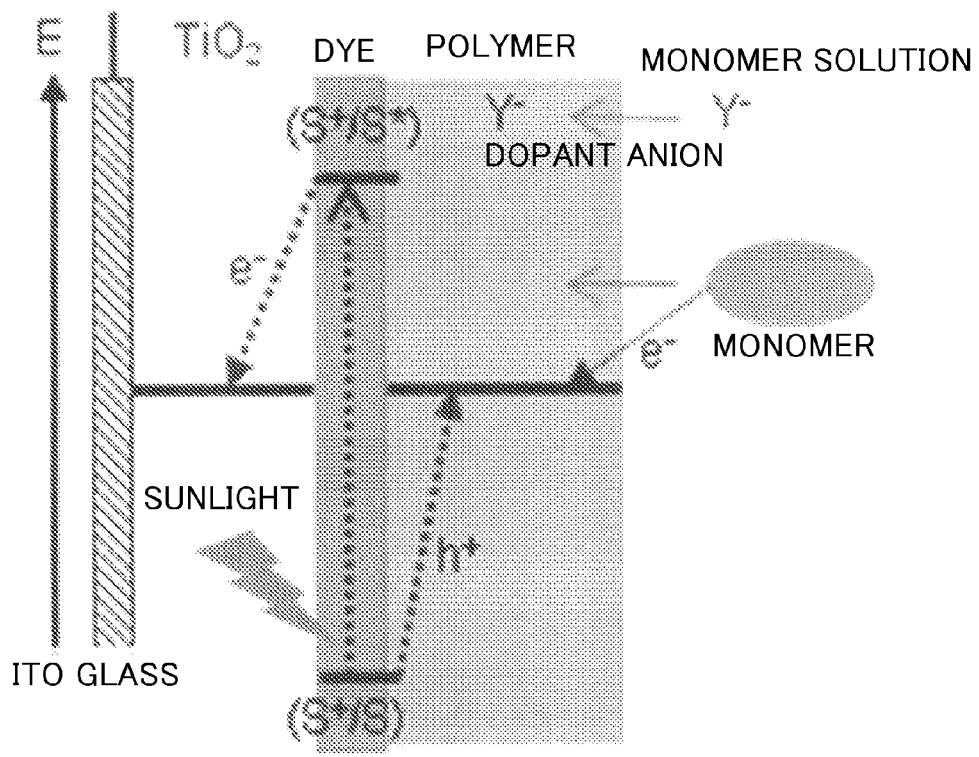
FIG. 26 is a schematic view explaining a polymerization process of a polymer by a photoanodic reaction.
Figure 27:
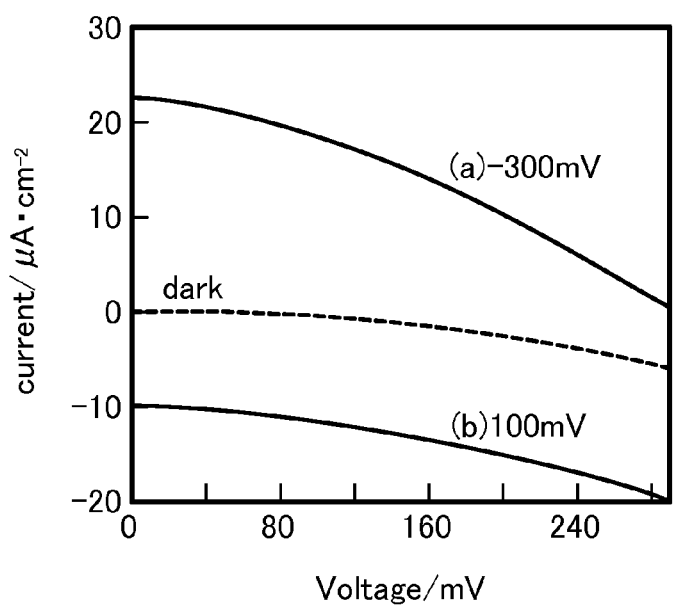
FIG. 27 is FIG. 3 of Non-Patent Document 1.

Incidentally, the polymerization process of a polymer due to the photoanodic reaction is hereunder described by reference to FIG. 26.

A monomer releases an electron and is polymerized into a polymer according to the following scheme.

In order to make a balance of electric charges, a dopant is taken into the polymer.

Monomer→Polymer+Electron (Oxidation Reaction=Polymerization Reaction)

Explanations of Letters or Numerals
(P) Electrically conductive polymer (black portion)
(N) Nanoparticle (white portion)
(H) Hole into which the electrically conductive polymer could not be filled (black portion whose depth is seen)

The invention claimed is:

1. A hetero pn junction semiconductor constituted of an electrically conductive polymer as a p-type semiconductor and an inorganic oxide as an n-type semiconductor, which is characterized in that the electrically conductive polymer is filled among nanoparticles of the inorganic oxide so as to satisfy the following Equation 1:

$$Vp/Vn = X \times \sigma n/\sigma p \quad (0.1 \leq X \leq 10) \qquad \text{<Equation 1>}$$

Vp=Volume of the electrically conductive polymer as a p-type semiconductor
σp=Electrical conductivity of the electrically conductive polymer as a p-type semiconductor
Vn=Volume of the inorganic oxide nanoparticles as an n-type semiconductor
σn=Electrical conductivity of the inorganic oxide nanoparticles as an n-type semiconductor.

2. The hetero pn junction semiconductor according to claim 1, which is characterized in that an average particle size of the nanoparticles of the inorganic oxide is not more than 200 nm.

3. A process for producing the hetero pn junction semiconductor according to claim 1, which is characterized by permeating a monomer of an electrically conductive polymer among nanoparticles of an inorganic oxide aggregated and adhered on a substrate; and thereafter, irradiating light upon which the nanoparticles generate holes and simultaneously applying a constant current by controlling at least one of a current density and a current application time, thereby polymerizing the monomer through a photo electrochemical reaction to form an electrically conductive polymer and thereby producing a hetero pn junction semiconductor.

4. A process for producing the hetero pn junction semiconductor according to claim 2, which is characterized by permeating a monomer of an electrically conductive polymer among nanoparticles of an inorganic oxide aggregated and adhered on a substrate; and thereafter, irradiating light upon which the nanoparticles generate holes and simultaneously applying a constant current by controlling at least one of a current density and a current application time, thereby polymerizing the monomer through a photo electrochemical reaction to form an electrically conductive polymer and thereby producing a hetero pn junction semiconductor.

* * * * *